United States Patent [19]
Yee

[11] Patent Number: 6,113,425
[45] Date of Patent: *Sep. 5, 2000

[54] ELECTRO-MAGNETIC INTERFERENCE SHIELDING

[75] Inventor: Dawson Yee, Beaverton, Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/023,380

[22] Filed: Feb. 13, 1998

[51] Int. Cl.[7] .................................................. H01R 13/648
[52] U.S. Cl. ............................................ 439/607; 439/620
[58] Field of Search ................................ 439/78, 81, 83, 439/84, 607, 608, 620, 621

[56] References Cited

U.S. PATENT DOCUMENTS

| | | |
|---|---|---|
| 4,498,120 | 2/1985 | Kaufman . |
| 4,546,408 | 10/1985 | Rodseth et al. . |
| 5,398,166 | 3/1995 | Yomezawa et al. . |
| 5,605,477 | 2/1997 | Wu et al. ................................. 439/620 |
| 5,621,363 | 4/1997 | Ogden et al. ............................. 333/12 |
| 5,624,277 | 4/1997 | Ward ....................................... 439/620 |
| 5,669,789 | 9/1997 | Law ......................................... 439/620 |
| 5,838,551 | 11/1998 | Chan ....................................... 361/818 |

OTHER PUBLICATIONS

"80960RX Debug Connector Design Guide", Intel Data Sheet, Rev. 4, Aug. 1997.
"EMI Design Guidelines for USB Components", Intel Data Sheet, pp 1–19 (no date).
"Mechanical Assembly and Customer Manufacturing Technology for S.E.C. Cartridge Processors", Intel Data Sheet, AP–588 Application Note, Jul. 1997, pp. 1–53.
"Single Edge Contact (S.E.C.) Cartridge", Intel Data Sheet, 1998, Packaging Databook, pp. 16–1 to 16–44 (no month) 1998.
Cunavelis et al., "External Module Heat Sink Fastened To Board", IBM Technical Disclosure Bulletin, vol. 14, No. 1, p. 182, Jun. 1971.

*Primary Examiner*—Lincoln Donovan
*Attorney, Agent, or Firm*—Blakely, Sokoloff, Taylor & Zafman LLP

[57] ABSTRACT

An interconnection between a cartridge and ground is described. The apparatus includes a cartridge and a shielding electrically coupled to the cartridge. The shielding is designed to electrically couple the cartridge to the substrate when the cartridge is attached to the substrate.

20 Claims, 5 Drawing Sheets

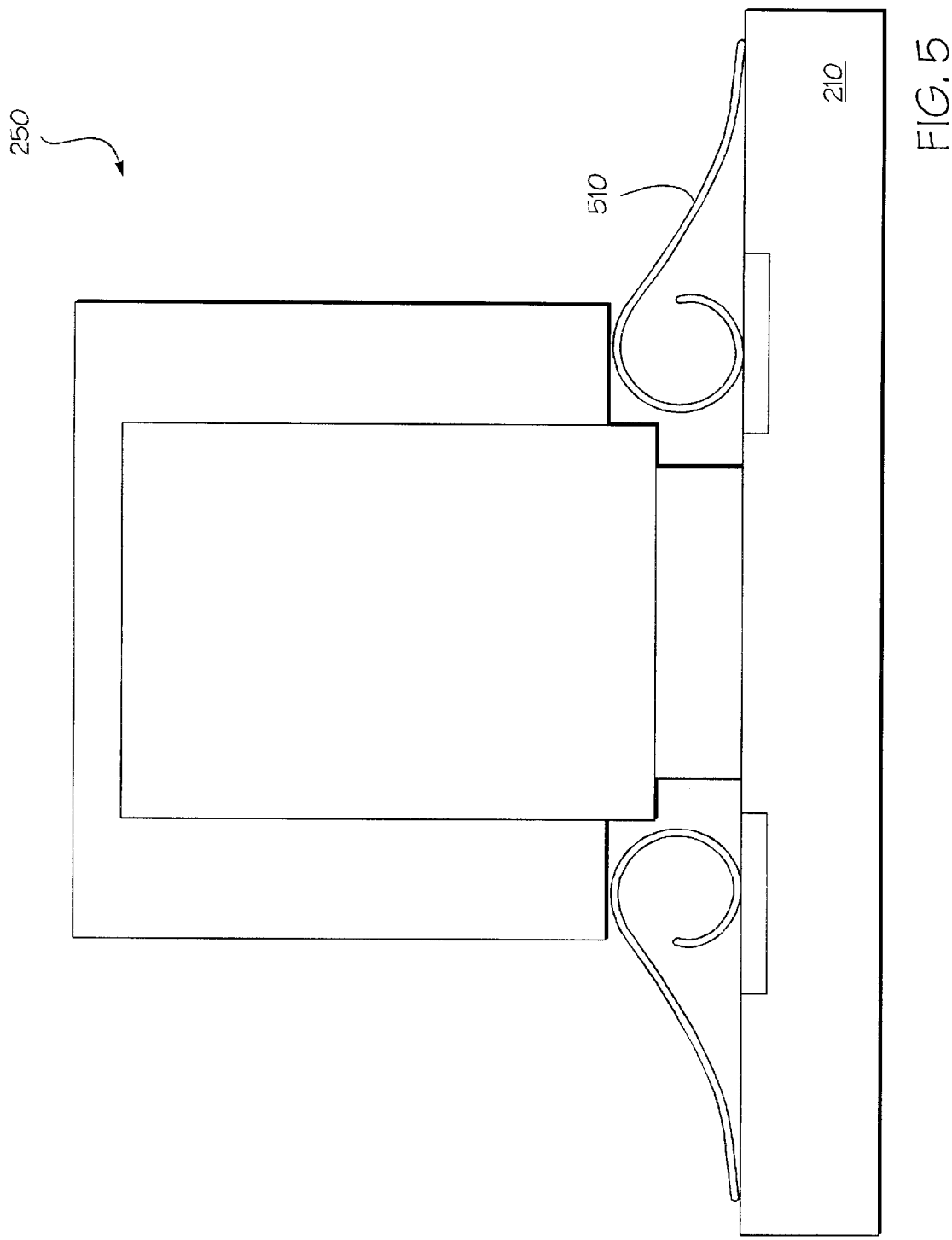

ELECTRO-MAGNETIC INTERFERENCE SHIELDING

FIELD OF THE INVENTION

The present invention relates to cartridges, and more specifically, to interconnections between a cartridge and ground.

BACKGROUND

Cartridges are used to interconnect electronic components encased in a cartridge and a substrate. These cartridges require at least one ground connection, for grounding various signals within the cartridge. Generally, ground is provided on a substrate to which the cartridge is connected.

FIG. 1 illustrates one prior art interconnection of a cartridge to ground. The substrate 110 includes a ground connection. The ground connection may be located on the back-side of the substrate 110. A cartridge 150 is attached to a connector. The connector 160 is designed to be coupled to the substrate 110 at a socket 130. The cartridge 150 is held in place on the substrate by a retaining clip 120.

Generally, the connector 160 includes a plurality of pins 170. The connector 160 also includes ground pins 180, designed to bring the ground signal from the substrate 110 to the cartridge 150.

However, using dedicated ground pins 180 has numerous disadvantages. The number of pins in the connector needs to be increased, increasing manufacturing cost and complexity. Alternatively, fewer pins are available for signals, because some of the pins are dedicated ground pins. Furthermore, the pins may have a high inductance, leading to decreased signal quality especially for high frequency signals. Furthermore, the pins do not reduce the electromagnetic interference (EMI) emissions that are generated by the cartridge 150. Additionally, for high speed connections, the EMI significantly affects the signals between the cartridge 150 and the substrate 110.

SUMMARY

An interconnection between a cartridge and ground is described. The apparatus includes a cartridge. For one embodiment, the apparatus further includes a shielding electrically coupled to the cartridge. The shielding is designed to electrically couple the cartridge to the substrate when the cartridge is attached to the substrate.

BRIEF DESCRIPTION OF THE DRAWINGS

The present invention is illustrated by way of example, and not by way of limitation, in the figures of the accompanying drawings and in which like reference numerals refer to similar elements and in which:

FIG. 5 illustrates another embodiment of the shielding.

DETAILED DESCRIPTION

A method and apparatus for a shielding designed to reduce electromagnetic interference is described. Specific materials are mentioned throughout this specification. However, one skilled in the art understands that other similar materials may be used without departing from the scope of the invention.

Figure 1:
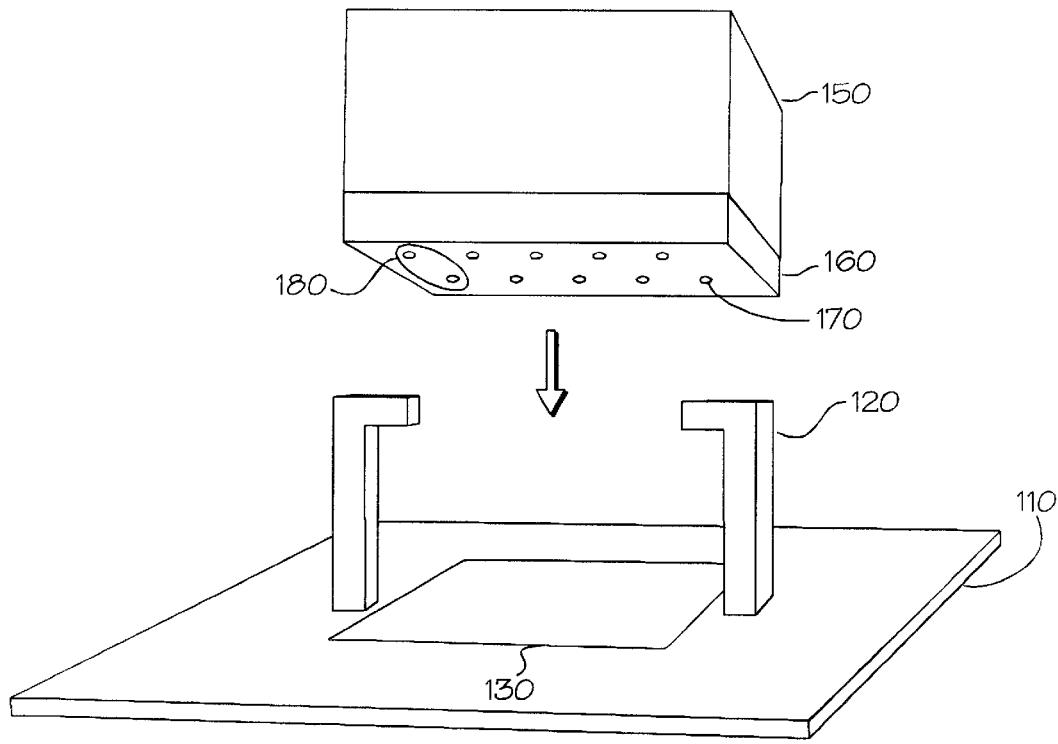
FIG. 1 illustrates a prior art interconnection between a cartridge and ground.
Figure 2:
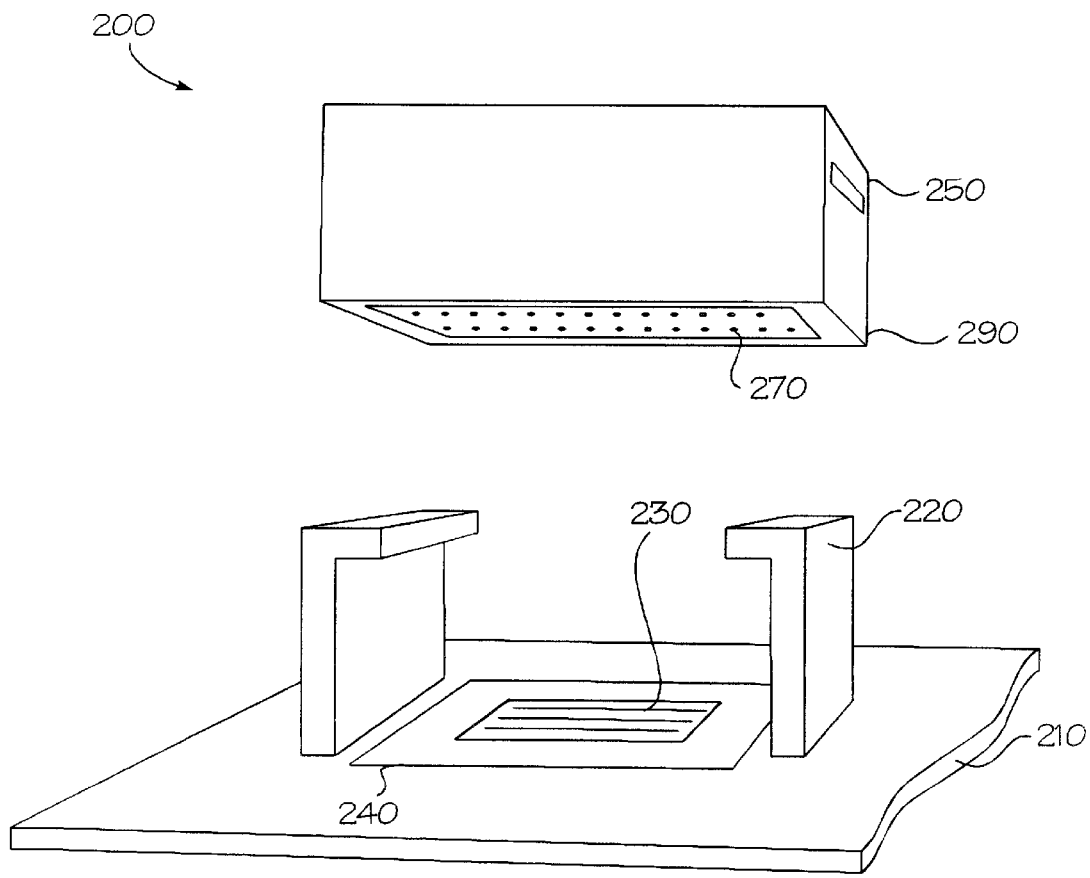
FIG. 2 illustrates one embodiment of the interconnection between a cartridge and ground according to the present invention.

FIG. 2 illustrates one embodiment of the interconnection of the present invention. The substrate 210 includes a retention mechanism 220, for receiving and retaining a cartridge 250. The retention mechanism 220 is positioned to removably connect a cartridge 250 to a contact area 230. For one embodiment, the retention mechanism 220 is a clip or an other means of fasting the cartridge assembly 200 to the substrate 210.

For one embodiment, the retention mechanism 220 is coupled to the top of the cartridge. For another embodiment, the retention mechanism 220 is coupled to receiving elements in the side of the cartridge (not shown). For one embodiment, the substrate 210 is a printed circuit board. For another embodiment, the substrate is a semiconductor substrate, a ceramic substrate, a fiberglass substrate, or a substrate made of another material. For one embodiment, the substrate 210 is a motherboard. For one embodiment, the substrate 210 includes other circuitry, to which the cartridge 250 is electrically coupled when the cartridge 250 is locked into the substrate 210.

The cartridge 250 includes a plurality of contacts 270. For one embodiment, the contacts 270 are gold fingers. For another embodiment, the contacts are pins. For one embodiment, at least some signals from the cartridge 250 are coupled to the contacts 270. For one embodiment, none of the contacts 270 are ground pins. Alternatively, other means of making contact with the contact area 230 in the substrate 210 may be used.

The system further includes a shielding 290. The shielding 290 is made of a conductive material, and is in electrical contact with the cartridge 250 when the cartridge 250 is coupled to the substrate 210. For one embodiment, the shielding 290 completely surrounds the base of the cartridge 250 when the cartridge is coupled to the substrate 210. For an alternative embodiment, the shielding 290 comprises multiple fingers that each extend between the cartridge 250 and the substrate 210. The shielding 290 makes contact with the substrate 210 at a contact area 240. For one embodiment, the shielding 290 is fastened to the substrate 210 at the contact area 240. For one embodiment, the shielding 290 is soldered to the substrate 210.

For one embodiment, the cartridge 250 includes a conductive enclosure (not shown). For one embodiment, the conductive enclosure is a case. Alternatively, the conductive enclosure is a liner made of a conductive material. This case or liner (not shown) is in electrical contact with the shielding 290 when the cartridge 250 is coupled to the substrate 210. The shielding 290 is in turn in electrical contact with a ground on the substrate 210.

For one embodiment, the entire cartridge 250 is surrounded by the shielding 290. For one embodiment, the cartridge 250 has a full conductive enclosure, i.e. the liner, the case, or the shielding 290 extends around the entire cartridge 250. The shielding 290 is coupled to the conductive enclosure of the cartridge 250. Therefore, when the cartridge 250 is coupled to the substrate 210, a seal is formed between the substrate 210 and the cartridge assembly 200. The conductive enclosure of the cartridge 250 and the shielding 290 together form a Faraday cage connection for the entire cartridge assembly 200. The Faraday cage keeps electromagnetic waves from entering or leaving the cage, i.e. the cartridge assembly. This is advantageous because it reduces the electromagnetic interference (EMI). Reduced EMI is especially useful for high speed signals.

For one embodiment, the cartridge 250 is a single edge contact (SEC) cartridge. For one embodiment, the cartridge 250 includes a microprocessor by Intel Corporation (Santa Clara, Calif.). For one embodiment, the microprocessor is the Pentium® II processor. Other components are located on the substrate 210. For one embodiment, the signals between the cartridge 250 and the substrate 210 are high speed signals.

Figure 3:
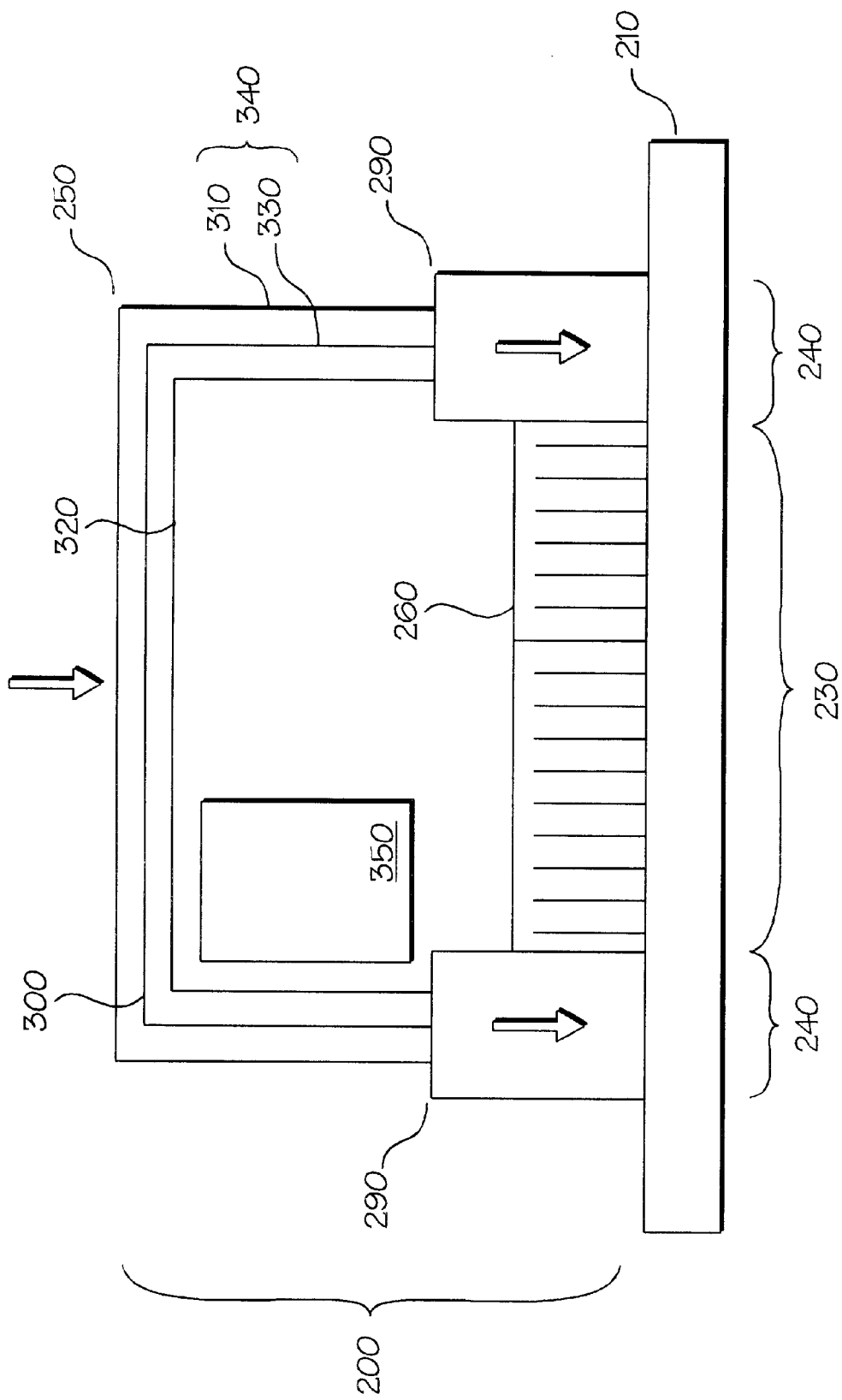
FIG. 3 illustrates a cross-section of the cartridge attached to the substrate.

FIG. 3 illustrates a cross-section of the cartridge 250 attached to the substrate 210. The cartridge assembly 200 is attached to the substrate 210 using a retention mechanism. The retention mechanism is not shown, for clarity. For one embodiment, the cartridge 250 includes electronic circuitry 350 enclosed in a conductive enclosure 340. For one embodiment, the cartridge 250 includes a substrate 320 to which the electronic circuitry 350 is coupled. The substrate 320 is enclosed in the conductive enclosure 340.

For one embodiment, the conductive enclosure 340 includes a case 310. The case 310 may be made of a hard material, to protect the electronic circuitry 350 in the cartridge 250. For one embodiment, the case 310 is conductive, and includes some metallic elements. For example, the case 310 may have metallic sides, or a metallic face. Alternatively, the case may be entirely metallic. The case 310 is not in direct contact with the electronic circuitry 350 in the cartridge 250. However, for one embodiment, ground contacts from the electronic circuitry 350 are coupled to the case 310, if the case 310 is conductive.

For another embodiment, the case 310 may be non-conductive. If the case 310 is non-conductive, the conductive enclosure 340 further includes a conductive lining 330. For one embodiment, the conductive lining 330 is metallic, or includes metallic elements. For one embodiment the conductive lining 330 is a flexible material. The conductive lining 330 is not in direct contact with the electronic circuitry 350 in the cartridge 250. However, for one embodiment, ground contacts from the electronic circuitry 350 are coupled to the conductive lining 330.

The conductive enclosure 340 is in electrical contact with a shielding 290. The substrate 210 includes a contact area 230 to which the pins 260 or gold fingers 260 of the cartridge 250 are coupled. The contact area 230, for one embodiment, is a socket for receiving the pins 260 or gold fingers 260 of the cartridge 250. The contact area 230 is surrounded by a ground contact area 240. For one embodiment, the ground contact area 240 forms a ring around the contact area 230. For another embodiment, the ground contact area 240 forms a rectangle around the contact area 230.

For one embodiment, the ground contact area 240 couples the ground plane of the substrate 210 to the shielding 290. Thus, via the conductive enclosure 340, the cartridge assembly 200 is grounded to the substrate 210.

Figure 4:
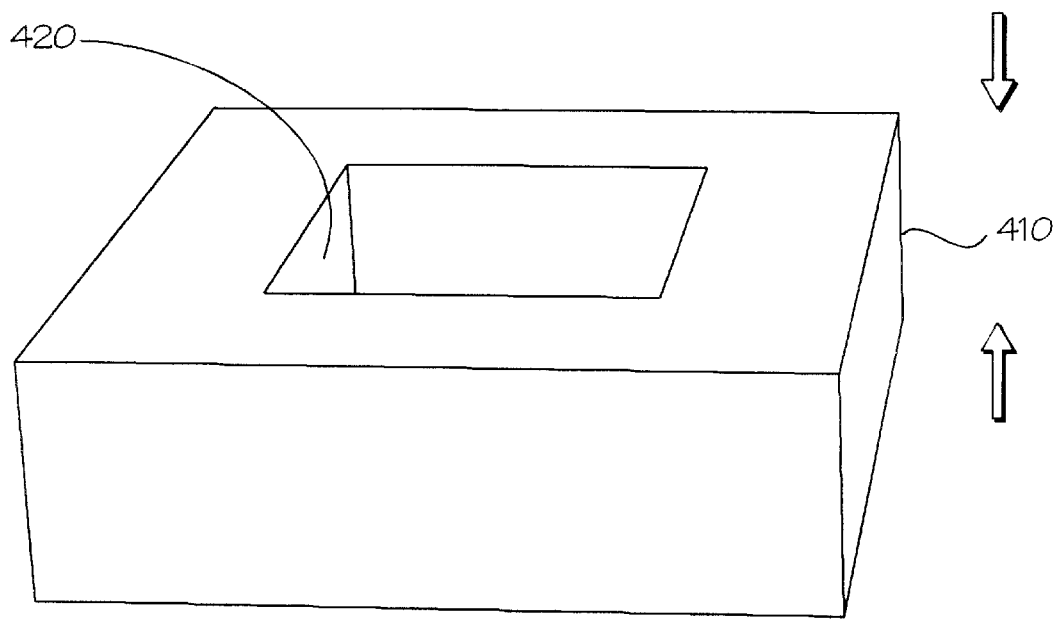
FIG. 4 illustrates one embodiment of the shielding.

FIG. 4 illustrates one embodiment of the shielding. For one embodiment, the shielding 410 is a rectangular shape. The shielding 410 has a void 420 in the center shaped to receive the cartridge. For one embodiment, the shielding 410 is a conductive foam. For one embodiment, the shielding 410 may be made of carbon, copper, copper foam, beryllium copper, stainless steel, or other conductive materials. When the cartridge assembly is coupled to the substrate, the cartridge assembly is locked to the substrate via a retention mechanism. The shielding 410 is slightly compressed when the cartridge assembly is locked to the substrate. The slightly compressed shielding 410 forms a good electrical connection between the cartridge assembly and the substrate.

FIG. 5 illustrates another embodiment of the shielding 510. For one embodiment, the shielding 510 includes a number of fingers. For another embodiment, the shielding 510 is a shaped foil that completely surrounds the base of the cartridge 250. For a third embodiment, the shielding 510 is a conductive curl having an adhesive surface that is used to attach the shielding 510 to the substrate or the cartridge. For one embodiment, the shielding 510 is made of metal. For one embodiment, the shielding 510 may be made of copper, carbon, beryllium copper, stainless steel, or other materials. The shielding 510 is flexible, such that when the cartridge 250 is coupled to the substrate 210, the shielding 510 is slightly compressed, forming a good electrical connection between the substrate 210, the shielding 510, and the case 340. For one embodiment, the shielding 510 is coupled to the substrate 210. For one embodiment, the shielding 510 is soldered to the substrate. For another embodiment, the shielding 510 is coupled to the cartridge 250.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   a cartridge including internal circuitry and electrical contacts, the cartridge configured to attach to a top surface of a substrate having a contact area, the electrical contacts forming a connection with the contact area when the cartridge is attached to the top surface of the substrate; and
   a shielding for the cartridge, the shielding configured to couple the top surface of the substrate to the cartridge and to couple electrically the cartridge to ground, the ground being provided by a portion of the top surface of the substrate encircling the contact area, and wherein the cartridge is configured to provide a ground signal to the internal circuitry in the cartridge.

2. The apparatus of claim 1, wherein the shielding provides a Faraday cage enclosure for the cartridge.

3. The apparatus of claim 1, wherein the internal circuitry of the cartridge includes a microprocessor.

4. The apparatus of claim 1, wherein the cartridge is a single edge connector (SEC) cartridge.

5. The apparatus of claim 1, wherein the electrical contacts of the cartridge include a plurality of pins for coupling signals between the cartridge and the substrate.

6. The apparatus of claim 5, wherein none of the pins of the cartridge are ground pins.

7. The apparatus of claim 1, wherein the electrical contacts of the cartridge include a plurality of gold fingers configured to couple signals between the cartridge and the substrate.

8. The apparatus of claim 1, wherein the cartridge further comprises a case enclosing the internal circuitry, and wherein the case includes conductive elements and is in electrical contact with the shielding.

9. The apparatus of claim 8, wherein the case comprises a conductive material.

10. The apparatus of claim 9, wherein the case is a metallic case.

11. The apparatus of claim 1, wherein the cartridge further comprises:
    a non-conductive case enclosing the internal circuitry; and a conductive case liner, the conductive case liner is configured to provide an electrical contact with the shielding.

12. The apparatus of claim 1, wherein the substrate comprises a circuit board.

13. An apparatus comprising:

a substrate;

a cartridge;

a case enclosing the cartridge; and a conductive shielding configured to couple electrically a ground signal to the case enclosing and the cartridge, the ground signal being provided from a rectangular ground area on a top surface of the substrate, and wherein the conductive shielding and the case together form a Faraday cage around the cartridge.

14. The apparatus of claim 13, wherein the conductive shielding comprises a conductive foam.

15. The apparatus of claim 13, wherein the conductive shielding comprises a plurality of conductive fingers.

16. The apparatus of claim 13, wherein the conductive shielding comprises a metallic film.

17. An apparatus comprising:

a cartridge including a conductive enclosure and circuitry enclosed within the conductive enclosure, the circuitry being configured to couple to a conductive area on a top surface of a substrate and the conductive enclosure configured to couple to a ground area encircling the conductive area on the top surface of the substrate; and a shielding configured to form an electrical connection with the conductive enclosure and to couple a ground signal from the ground area on the substrate to the conductive enclosure.

18. The apparatus of claim 17, wherein the conductive enclosure and the shielding together form a Faraday cage.

19. The apparatus of claim 17, wherein the conductive enclosure provides the ground signal to the circuitry.

20. The apparatus of claim 13, wherein the conductive shielding provides the ground signal to circuitry enclosed within the cartridge.

* * * * *